United States Patent
Yagi et al.

(10) Patent No.: US 9,496,310 B2
(45) Date of Patent: Nov. 15, 2016

(54) PHOTODETECTOR, METHOD OF MANUFACTURING PHOTODETECTOR, RADIATION DETECTOR, AND RADIATION DETECTION APPARATUS

(71) Applicant: KABUSHIKI KAISHA TOSHIBA, Tokyo (JP)

(72) Inventors: Hitoshi Yagi, Kanagawa (JP); Rei Hasegawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/883,117

(22) Filed: Oct. 14, 2015

(65) Prior Publication Data

US 2016/0254310 A1   Sep. 1, 2016

(30) Foreign Application Priority Data

Feb. 26, 2015   (JP) .................................. 2015-037183

(51) Int. Cl.
  *H01L 27/146*   (2006.01)
(52) U.S. Cl.
  CPC ... *H01L 27/14663* (2013.01); *H01L 27/14623* (2013.01); *H01L 27/14685* (2013.01)
(58) Field of Classification Search
  CPC .................. H01L 27/14663; H01L 27/14685; H01L 27/14623
  See application file for complete search history.

(56) References Cited

U.S. PATENT DOCUMENTS

| | | |
|---|---|---|
| 8,008,741 B2 | 8/2011 | Yamamura et al. |
| 2009/0256223 A1* | 10/2009 | Yamamura et al. ........... H01L 27/1446 257/432 |
| 2009/0283311 A1* | 11/2009 | Ida ........................ H01L 23/481 174/260 |
| 2010/0052192 A1 | 3/2010 | Hasegawa et al. |
| 2015/0084149 A1 | 3/2015 | Yagi et al. |

FOREIGN PATENT DOCUMENTS

| | | |
|---|---|---|
| JP | 2010-56170 | 3/2010 |
| JP | 2011-100903 | 5/2011 |
| JP | 4707885 | 6/2011 |
| JP | 5183471 | 4/2013 |
| JP | 2015-055507 | 3/2015 |
| JP | 2015-61041 | 3/2015 |

OTHER PUBLICATIONS

Mazzillo, M., et al., "High Fill Factor P-on-N Silicon Photomultipliers for Blue Light Detection", ST Microelectronics/Fermilab. IEEE (Oct. 29-Nov. 3, 2012), 1 page.

Pagano, R., et al., "Dark Current in Silicon Photomultiplier Pixels: Data and Model", IEEE Transactions on Electron Devices, vol. 59, No. 9, (Sep. 9, 2012) pp. 2410-2416.

(Continued)

*Primary Examiner* — Victor A Mandala
(74) *Attorney, Agent, or Firm* — Finnegan, Henderson, Farabow, Garrett & Dunner LLP (57) ABSTRACT

A photodetector according to an embodiment includes: a semiconductor substrate with a first and second faces; a groove formed on the second face; pixels disposed to the semiconductor substrate, each pixel including: light detection cells disposed on the first face, each light detection cell having a first and second terminals, each light detection cell being surrounded by the groove; a first wiring line disposed on the first face to connect to the first terminal of each of the detection cells; a first opening formed in the second face and penetrating the semiconductor substrate; a first insulating film covering the second face, a side face of the first opening, and a side face and a bottom of the groove; a second opening formed in the first insulating film; a first and second electrodes disposed in the first and second openings respectively; and a light blocking material filled to the groove.

14 Claims, 12 Drawing Sheets

(56) References Cited

OTHER PUBLICATIONS

Pagano, R., et al., "Understanding dark current in pixels of silicon photomultipliers", IEEE (2010) pp. 265-268).

Mazzillo, M., et al., "High Fill Factor P-on-N Silicon Photomultipliers for Blue Light Detection", IEEE Nuclear Science Symposium and Medical Imaging Conference Record (NSS/MIC), N1-187, (2012) pp. 391-398.

* cited by examiner

PHOTODETECTOR, METHOD OF MANUFACTURING PHOTODETECTOR, RADIATION DETECTOR, AND RADIATION DETECTION APPARATUS

CROSS REFERENCE TO RELATED APPLICATIONS

This application is based upon and claims the benefit of priority from prior Japanese Patent Application No. 2015-037183 filed on Feb. 26, 2015 in Japan, the entire contents of which are incorporated herein by reference.

FIELD

Embodiments described herein relate generally to a photodetector, a method of manufacturing the photodetector, a radiation detector, and a radiation detection apparatus.

BACKGROUND

Photodetectors in which light detection cells with avalanche photodiodes ("APDs") operating in Geiger mode are arranged in arrays have been studied in order to achieve photodetectors with high sensitivity. These photodetectors count the number of photons that are incident thereto. The APD operating in Geiger mode is a photodiode that emits one current pulse per one photon incident thereto. An array including the light detection cells with the APDs provides a current pulse having a height proportional to the number of light detection cells receiving the photons. Thus, the number of photons incident to each photodetector can be measured from the pulse height.

Radiation detectors including scintillators and photodetectors are also known. The scintillators receiving radiation rays emit visible light rays, which may be detected by photodetectors such as photodiodes and photomultipliers. The number of photons in the visible light rays emitted from a scintillator is proportional to the radiation energy incident to the scintillator. Therefore, the radiation energy may be measured by counting the number of photons included in the visible light rays emitted from the scintillator. This can be performed by means of a photodetector in which light detection cells including APDs operating in Geiger mode are arranged in an array.

Photodetector arrays are used for image sensors. Radiation detector arrays in which radiation detectors with scintillators and photodetectors are arranged in an array are included in computed tomography apparatuses using X-rays. In both the cases, many pixels are required to be disposed with a high density in order to obtain high-quality images. In these cases, wires for taking electric signals from a photodetector with many pixels arrange at a high density are generally connected using a through-electrode called "TSV (Through Silicon Via)" since it is difficult to connect these wires by wire bonding.

The TSV formed in a photodetector in which light detection cells including APDs operating in Geiger mode are arranged in an array is effective to obtain images with a high sensitivity and a high quality.

A problem is known for the arrays of light detection cells including APDs operating in Geiger mode that light rays in a wavelength band from the visible light to the far-infrared light are radiated from a light detection cell to which photons enter, and the radiation rays enter adjacent light detection cells ("optical crosstalk").

A technique is known to solve this problem, in which trenches are formed between adjacent two light detection cells with APDs from a side opposite to the substrate on which the light detection cells are formed, i.e., from the light detection cell side, and filled with black resist or a metal such as tungsten. This blocks light rays from adjacent light detection cells to prevent the optical crosstalk.

The optical crosstalk prevention technique has the following problems. During the manufacture, the light detection cells with the APDs are generally subjected to a high-temperature process performed at a temperature of 400° C. or more. Therefore, black resist, which generally does not bear such high temperatures, cannot be actually used.

A metal such as tungsten is generally filled into the trenches by sputtering or chemical vapor deposition (CVD). However, these methods, which are generally used to form thin films, are not capable of filling the trenches efficiently. Therefore, voids may be caused to reduce the reliability.

DETAILED DESCRIPTION

A photodetector according to an embodiment includes: a semiconductor substrate with a first face and a second face that is opposite to the first face; a groove formed on the second face of the semiconductor substrate; a plurality of pixels disposed to the semiconductor substrate, each pixel including: a plurality of light detection cells disposed on the first face of the semiconductor substrate, each light detection cell having a first terminal and a second terminal that connect to the semiconductor substrate, each light detection cell being surrounded by the groove when viewed from a side of the second face of the semiconductor substrate; a first wiring line disposed on the first face of the semiconductor substrate to connect to the first terminal of each of the light detection cells; a first opening formed in the second face of the semiconductor substrate, the first opening penetrating the semiconductor substrate to expose a part of the first wiring line; a first insulating film covering the second face of the semiconductor substrate, a side face of the first opening, and a side face and a bottom of the groove; a second opening formed in the first insulating film to expose a part of the second face of the semiconductor substrate; a first electrode disposed in the first opening to connect to the first wiring line; a second electrode disposed in the second opening to connect to the second face of the semiconductor substrate; and a light blocking material filled to the groove.

The embodiments of the present invention will be described below with reference to the accompanying drawings. It should be noted, however, that the drawings are schematically illustrated, and the relationship between the thickness and the planar dimensions, and the ratio among the thicknesses of the respective layers in each drawing may be different from those of actual devices. The actual thicknesses and dimensions, therefore, should be determined in consideration of the following descriptions. Furthermore, the relationship and the ratio between the dimensions may differ between the drawings.

First Embodiment

Figure 1:
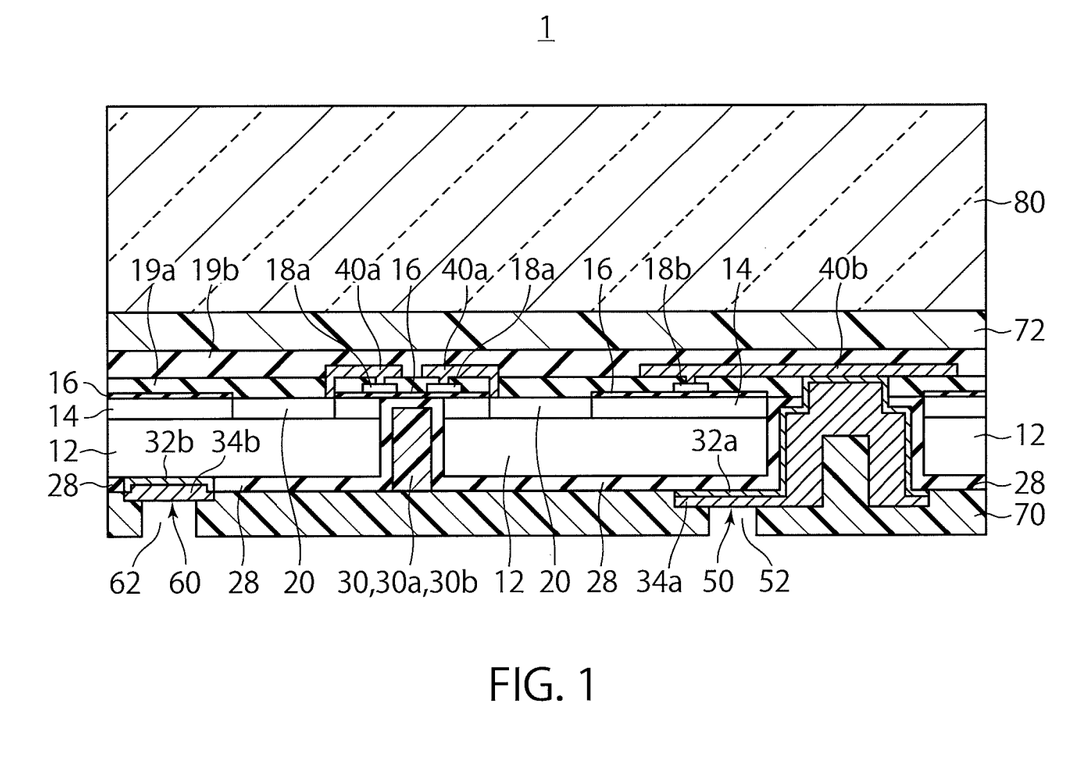
FIG. 1 is a cross-sectional view of a photodetector according to a first embodiment.
Figure 2:
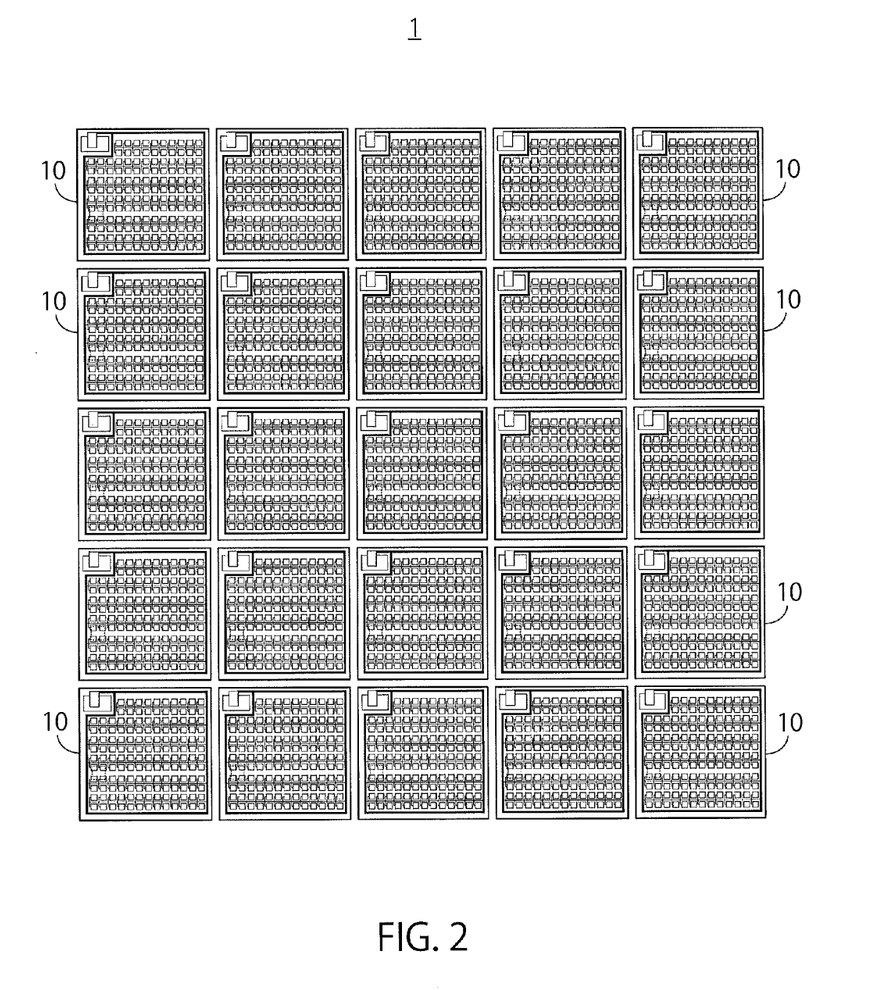
FIG. 2 is a plan view of a pixel array of the photodetector according to the first embodiment.
Figure 3:
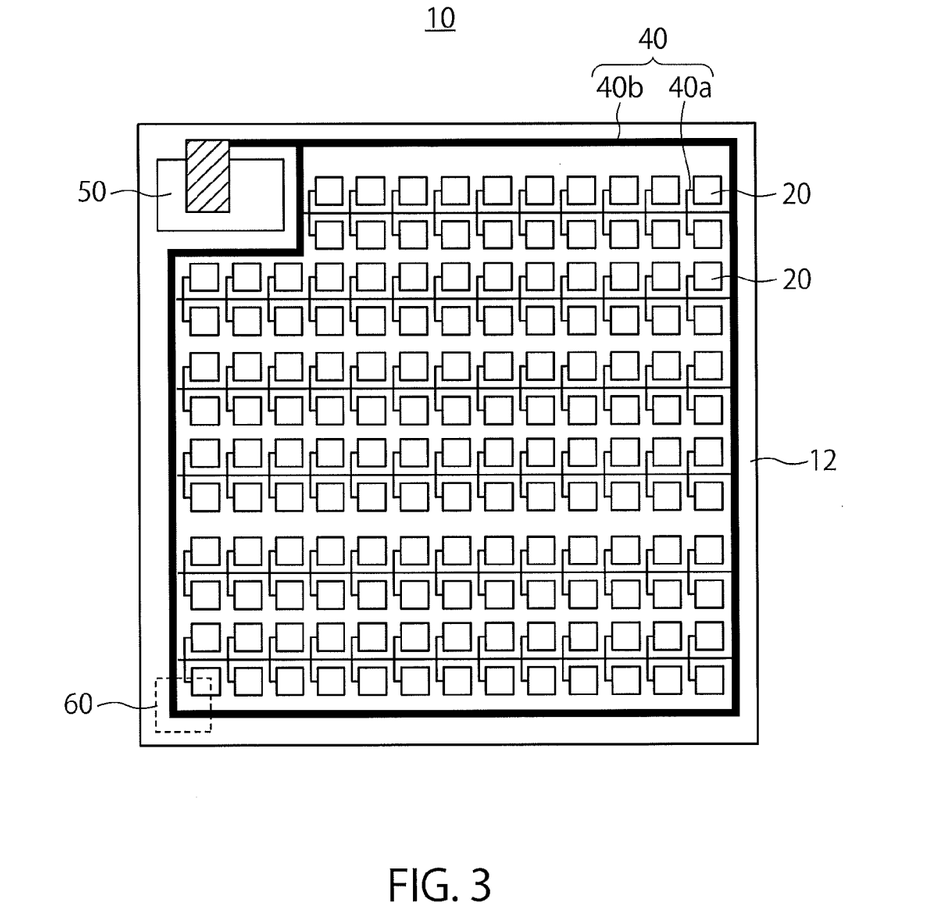
FIG. 3 is a plan view of one of the pixels of the photodetector according to the first embodiment.
Figure 4:
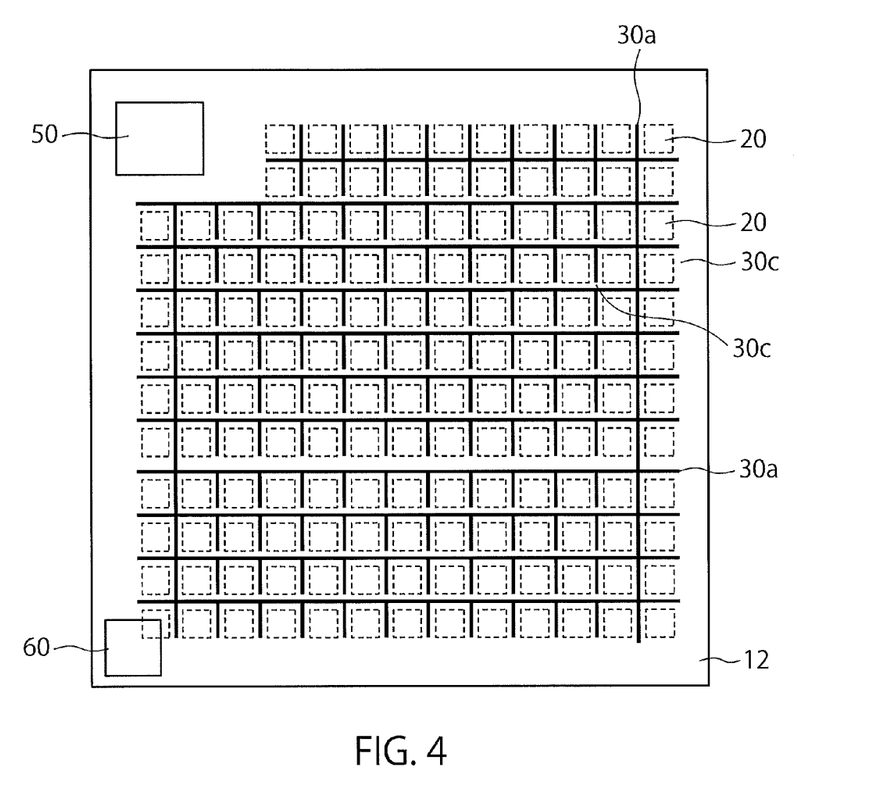
FIG. 4 is a plan view showing light-blocking grooves of the photodetector according to the first embodiment.

A photodetector according to a first embodiment will be described below with reference to FIGS. 1 to 4. FIG. 1 is a cross-sectional view of the photodetector 1 according to the first embodiment. FIG. 2 is a plan view of the photodetector 1 according to the first embodiment, and FIG. 3 is a plan view of one of the pixels of the photodetector 1 according to the first embodiment. FIG. 4 is a plan view showing light-blocking grooves of the photodetector 1 according to the first embodiment.

As shown in FIG. 2, the photodetector 1 according to the first embodiment includes a plurality of pixels 10 arranged to form an array. FIG. 2 shows a pixel array with five rows and five columns. As shown in FIG. 3, each pixel 10 is formed on an n-type silicon substrate 12, for example, and includes a plurality of light detection cells 20 arranged in an array, wiring lines 40 of aluminum (Al), for example, a TSV (Through Silicon Via) electrode 50, and a backside electrode 60. The wiring lines 40 include wiring lines 40a disposed near the light detection cells 20, and a wiring line 40b connecting to the wiring lines 40a and extends around the pixel 10. As will be described later, the TSV electrode 50 and the backside electrode 60 are disposed on the opposite side of the silicon substrate 12 to the light detection cells 20.

Each light detection cell 20 includes an avalanche photodiode (APD). The light detection cells 20 include first terminals, which are connected in parallel by the wiring lines 40a, 40b formed of Al, for example. The wiring line 40b is connected to the TSV electrode 50 located at a corner of each pixel. It is at the upper left corner in FIG. 3. The backside electrode 60 is located at another corner that is different from the corner where the TSV electrode 50 is present. It is at the lower left corner in FIG. 3. As will be described later, the backside electrode 60 is connected to second terminals of the light detection cells 20 via the silicon substrate 12.

The cross-sectional structure of the photodetector 1 according to the first embodiment will be described with reference to FIG. 1.

A $p^-$ epitaxial layer 14 is disposed on the silicon substrate 12, which is an $n^+$ silicon substrate, and the light detection cells 20 with the APDs are disposed on the epitaxial layer 14. The light detection cells 20 are isolated from each other by an insulating film 16 of silicon oxide, for example, disposed on the epitaxial layer 14. The insulating film 16 is formed by, for example, local oxidation of silicon (LOCOS).

On the insulating film 16 are disposed resistors 18a, 18b of polycrystalline silicon, for example, at locations corresponding to the light detection cells. The resistors 18a, 18b, the light detection cells 20, and the insulating film 16 are covered by an interlayer insulating film 19a of silicon oxide, for example. The interlayer insulating film 19a has first contacts of Al, for example, which connect to the light detection cells 20, and second contacts of Al, for example, connecting to the resistors 18a. The first contacts and the second contacts are connected by the wiring lines 40a disposed on the interlayer insulating film 19a. The interlayer insulating film 19a also includes third contacts connecting to the resistors 18b. The third contacts are connected by the wiring lines 40b connecting to the TSV electrode 50. The resistors 18a and the resistors 18b are connected in series via the corresponding light detection cells 20 and the wiring lines 40a.

An interlayer insulating film 19b of silicon oxide, for example, is disposed to cover the interlayer insulating film 19a and the wiring lines 40a, 40b. A transparent support member 80 of glass, for example, is disposed on the interlayer insulating film 19b via an adhesion layer 72. Light rays are incident to the light detection cells 20 through the support member 80. The adhesion layer 72 has a transparency sufficient to pass light rays. The thickness of the adhesion layer 72 is about a few tens to 100 μm.

The TSV electrode 50, the backside electrode 60, and light blocking portions 30 are disposed on a surface of the silicon substrate 12 that is opposite (back surface) to the surface where the light detection cells 20 are present (top surface).

The TSV electrode 50 is formed in a first opening formed on the back surface side of the silicon substrate 12. The bottom of the first opening reaches the wiring line 40b. The TSV electrode 50 includes a barrier metal layer 32a of Ti, for example, covering the bottom and the side surface of the first opening, and an electrode layer 34a of Cu, for example, covering the barrier metal layer 32a. The barrier metal layer 32a of the TSV electrode 50 is electrically insulated from the silicon substrate 12 and the epitaxial layer 14 by an insulating film 28 of silicon oxide, for example.

The backside electrode 60 is disposed on the back surface side of the silicon substrate 12. The insulating film 28 has a second opening reaching the back surface of the silicon substrate 12. The backside electrode 60 is formed in the second opening. The backside electrode 60 includes a barrier metal layer 32b of titanium (Ti), for example, covering the bottom and the side surface of the second opening, and an electrode layer 34b of copper (Cu), for example, covering the barrier metal layer 32b.

The light blocking portion 30 includes a light-blocking groove 30a penetrating the silicon substrate 12 and the epitaxial layer 14 to reach the insulating film 16, and a light blocking material 30b being filled into the light-blocking groove 30a. In the first embodiment, black resist is used as the light blocking material 30b. Furthermore, in the first embodiment, the insulating film 28 is disposed between the bottom and the side surface of the light-blocking groove 30a and the light blocking material 30b. If the light blocking material 30b is an electrically insulating material, the insulating film 28 is not needed between the bottom and the side surface of the light-blocking groove 30a and the light blocking material 30b.

As shown in FIG. 4, the light-blocking grooves 30a are arranged to apparently surround the respective light detection cells 20 when viewed from the back surface side of the silicon substrate 12. However, at least one opening 30c is provided for each light detection cell 20. Thus, the light-blocking grooves 30a are arranged to form open curves instead of closed curves completely surrounding the respective light detection cells 20 when viewed from the back surface side of the silicon substrate 12. Since the light-blocking grooves 30a have at least one opening 30c for each light detection cell 20, the silicon substrate 12 is not completely divided into components each including a light detection cell 20 by the light-blocking grooves 30a. Therefore, all of the light detection cells 20 in the pixel 10 may be connected to the backside electrode 60 via the silicon substrate 12 that is not divided. Thus, the presence of the at least one opening 30c for each light detection cell 20 disposed to the light-blocking groove 30a reduces the number of backside electrodes. In the first embodiment, one backside electrode is disposed to one pixel, not to one light detection cell 20. Therefore, the pixel area and the light detection cell area may be reduced in this manner.

Returning to FIG. 1, the TSV electrode 50, the backside electrode 60, and the light blocking portion 30 are covered by a solder resist 70, for example. An opening 52 is formed in the solder resist 70 and reaches the TSV electrode 50, and an opening 62 is formed in the solder resist 70 and reaches the backside electrode 60. The TSV electrode 50 and the backside electrode 60 are connected to a pad of the mounting substrate (not shown) via the opening 52 and the opening 62, respectively.

(Manufacturing Method)

A method of manufacturing the photodetector 1 according to the first embodiment will be described below with reference to FIGS. 5 to 13.

Figure 5:
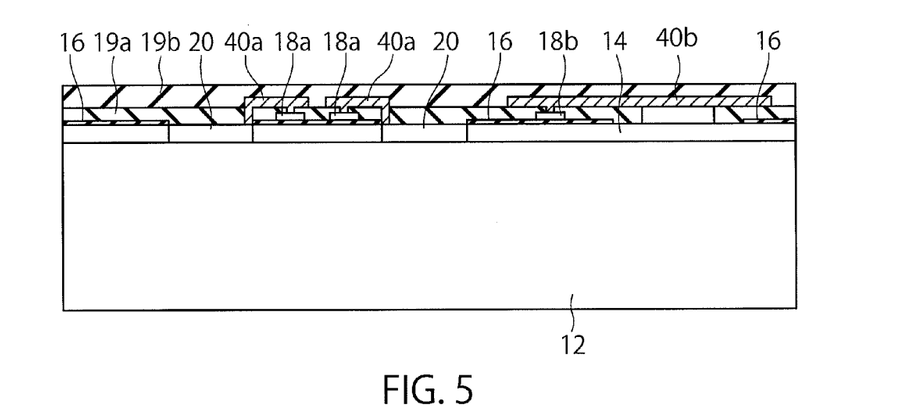
FIG. 5 is a cross-sectional view showing a method of manufacturing the photodetector according to the first embodiment.

First, a plurality of light detection cells 20 are formed on a silicon substrate 12 using well-known techniques as shown in FIG. 5. The silicon substrate is, for example, an epitaxially grown silicon substrate in which a p-type epitaxial layer 14 having a thickness of 2 μm is formed on an n-type silicon substrate 12 having a thickness of 725 μm. The light detection cells 20 are formed on the epitaxial layer 14. Each light detection cell 20 includes an avalanche photodiode (APD). Thereafter, a silicon nitride film serving as a mask is formed on the light detection cells, and an insulating film 16 is formed on the exposed epitaxial layer 14 by LOCOS. As a result, adjacent light detection cells 20 become isolated from each other by the insulating film 16.

Resistors 18a, 18b of polycrystalline silicon, for example, are formed on the insulating film 16. Thereafter, an interlayer insulating film 19a of silicon oxide, for example, is formed to cover the light detection cells 20, the resistors 18a, 18b, and the insulating film 16. Contact holes are formed through the interlayer insulating film 19a so as to reach the light detection cells 20 and the resistors 18a, 18b. A metal wiring layer of Al, for example, is formed on the interlayer insulating film 19a to fill the contact holes. The contact holes filled with Al form contacts. The metal wiring layer is patterned to form wiring lines 40a, 40b. An interlayer insulating film 19b of silicon oxide, for example, is formed on the interlayer insulating film 19a to cover the wiring lines 40a, 40b (FIG. 5).

Figure 6:
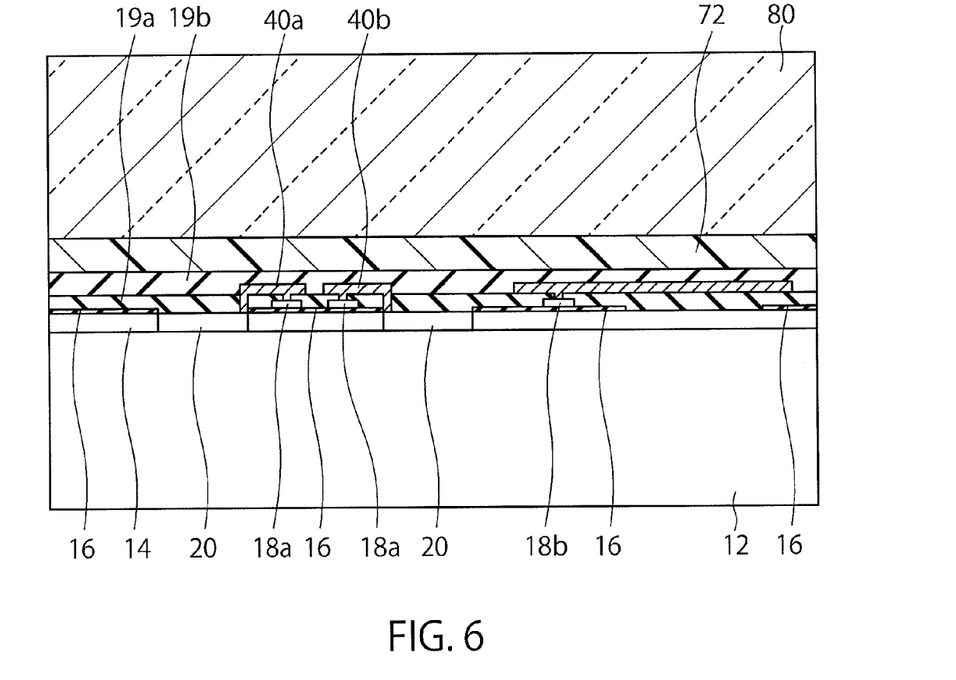
FIG. 6 is a cross-sectional view showing the method of manufacturing the photodetector according to the first embodiment.
Figure 7:
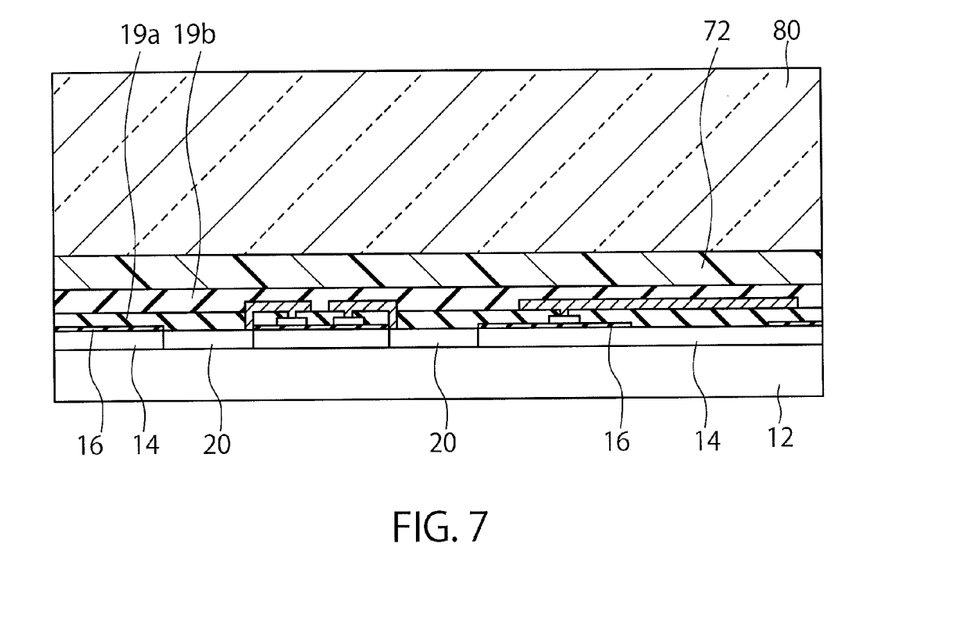
FIG. 7 is a cross-sectional view showing the method of manufacturing the photodetector according to the first embodiment.

Thereafter, an adhesion layer 72 is applied to the interlayer insulating film 19b, and a transparent support member 80 of glass, for example, is disposed on the adhesion layer 72 so that the interlayer insulating film 19b and the support member 80 are bonded with the adhesion layer 72, as shown in FIG. 6. The thickness of the support member 80 is, for example, 350 μm. Subsequently, the silicon substrate 12 is ground to have a thickness of about 10 μm to 40 μm using the support member 80 as a support, as shown in FIG. 7.

Figure 8:
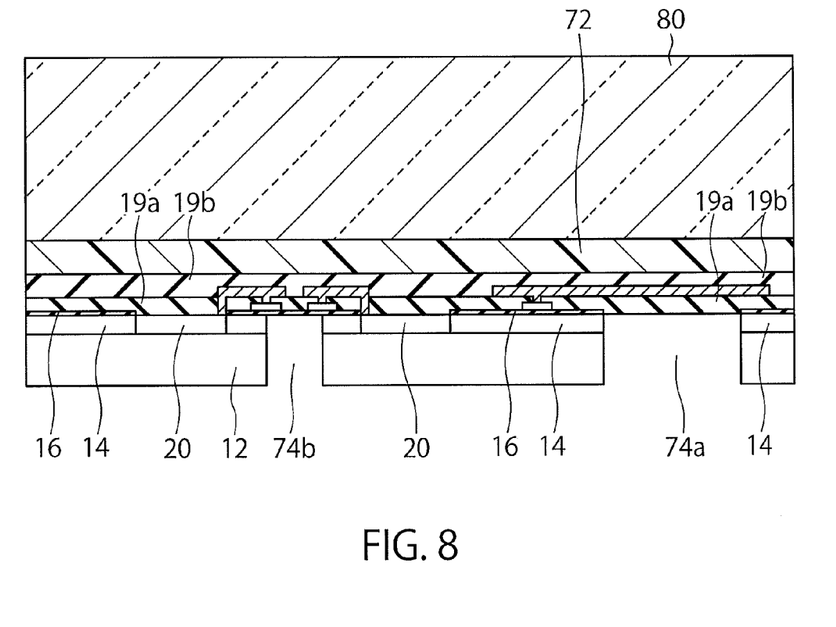
FIG. 8 is a cross-sectional view showing the method of manufacturing the photodetector according to the first embodiment.
Figure 9:
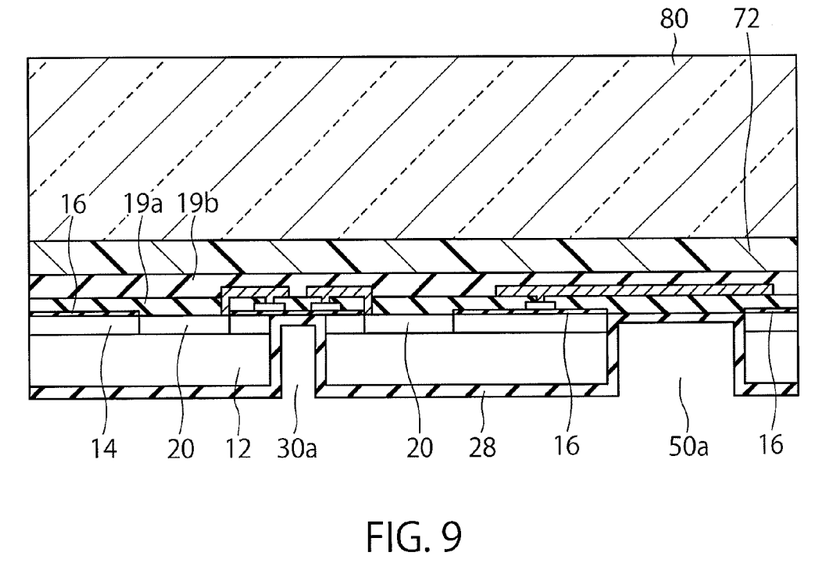
FIG. 9 is a cross-sectional view showing the method of manufacturing the photodetector according to the first embodiment.

Then, openings 74a, 74b are formed by reactive ion etching (RIE) at locations where a TSV electrode 50 and a light blocking portion 30 are to be formed, as shown in FIG. 8. The bottom of the opening 74a is at the interlayer insulating film 19a, and the bottom of the opening 74b is at the insulating film 16. Thereafter, a silicon oxide film 28 is formed by chemical vapor deposition (CVD) on the bottom and the side surface of each of the openings 74a, 74b and the exposed back surface of the silicon substrate 12, as shown in FIG. 9. This makes the opening 74a become an opening 50a for the TSV, and the opening 74b become a light-blocking groove 30a.

Figure 10:
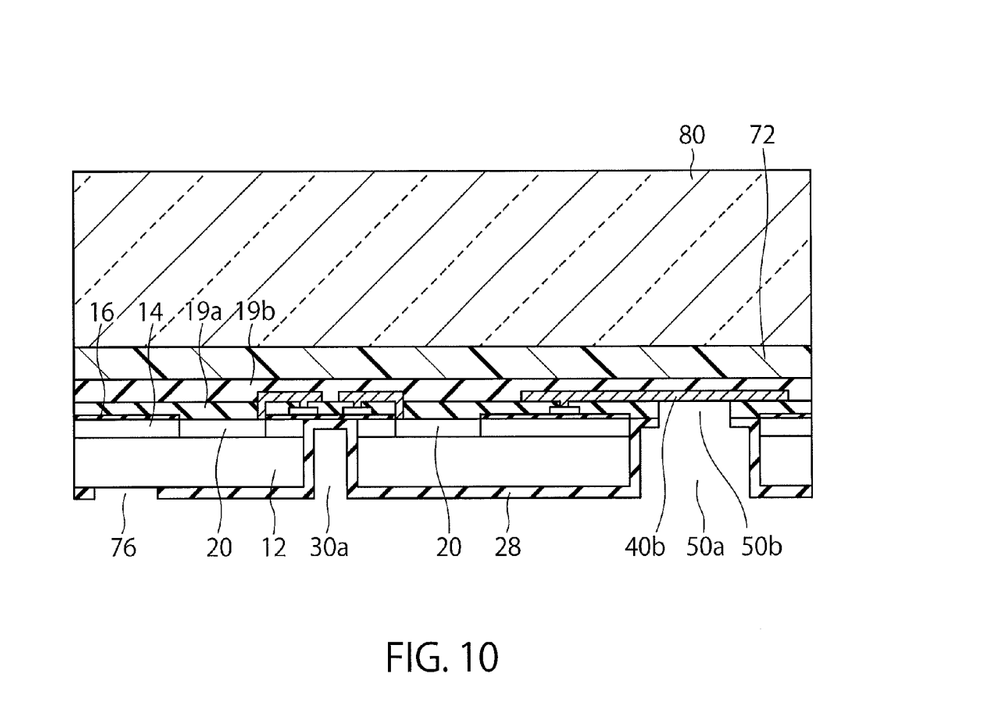
FIG. 10 is a cross-sectional view showing the method of manufacturing the photodetector according to the first embodiment.

Thereafter, an opening 50b communicating with the wiring line 40b is formed at the bottom of the opening 50a for the TSV, and an opening 76 reaching to the back surface of the silicon substrate 12 is formed at a location where the backside electrode is to be formed, as shown in FIG. 10.

Figure 11:
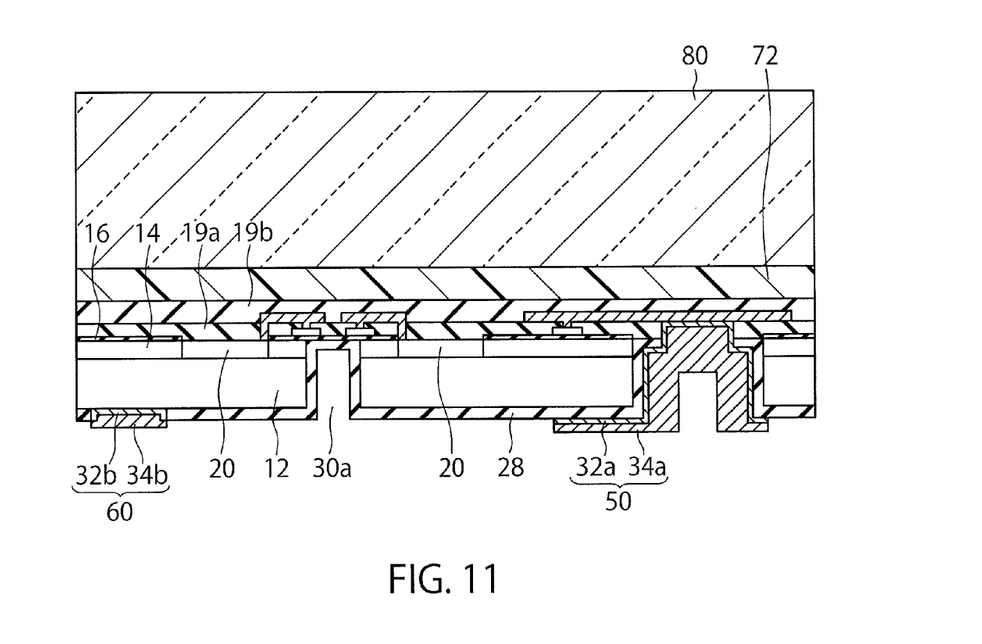
FIG. 11 is a cross-sectional view showing the method of manufacturing the photodetector according to the first embodiment.

Subsequently, the TSV electrode 50 including a barrier metal layer 32a of Ti and an electrode layer 34a of Cu is formed on the bottom and the side surface of the openings 50a, 50b, and the backside electrode 60 including a barrier metal layer 32b of Ti and an electrode layer 34b of Cu is formed on the bottom and the side surface of the opening 76, as shown in FIG. 11. The barrier metal layers of Ti are formed by sputtering, and the electrode layers of Cu are formed by plating. If the electrodes are formed by plating, at least one metal selected from the group consisting of gold (Au), silver (Ag), nickel (Ni), Zinc (Zn), chromium (Cr), and tin (Sn) may be used instead of Cu.

Figure 12:
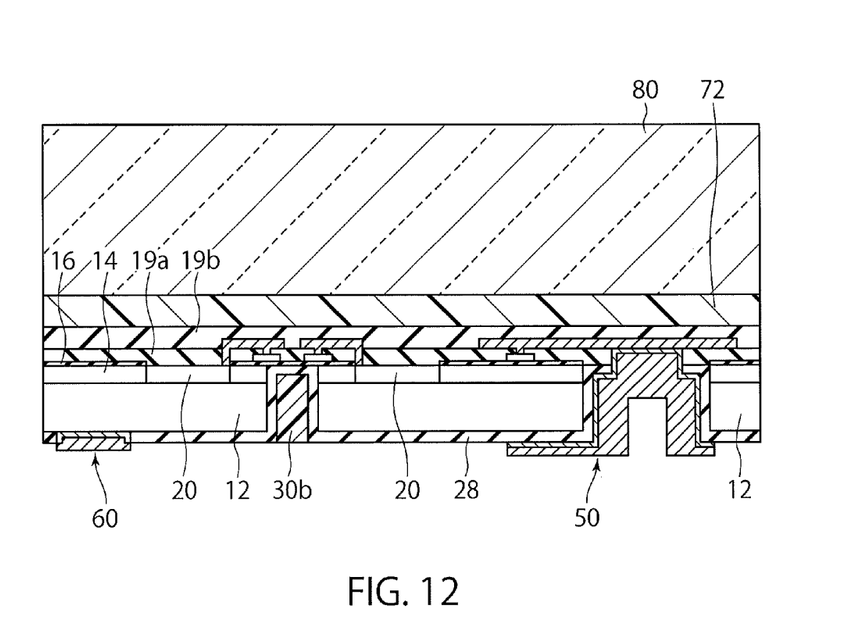
FIG. 12 is a cross-sectional view showing the method of manufacturing the photodetector according to the first embodiment.
Figure 13:
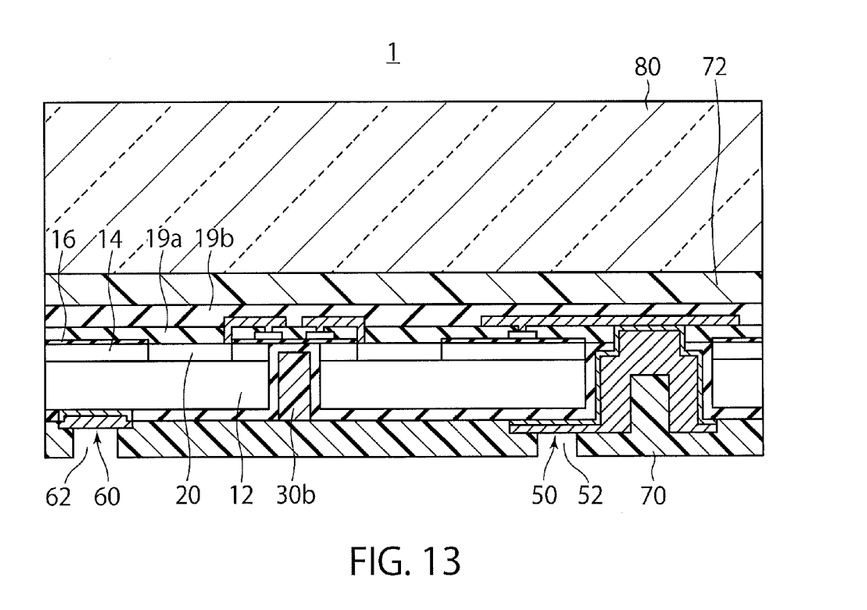
FIG. 13 is a cross-sectional view showing the method of manufacturing the photodetector according to the first embodiment.

Thereafter, black resist serving as the light blocking material 30b is selectively filled into the light-blocking groove 30a to form a light blocking portion as shown in FIG. 12. Thereafter, a solder resist 70 is applied to the back surface of the silicon substrate 12 to cover the TSV electrode 50, the backside electrode 60, and the light blocking portion, as shown in FIG. 13. Subsequently, openings 52, 62 to reach the TSV electrode 50 and the backside electrode 60 are formed, and a thermosetting treatment is performed at a temperature of 200° C. or less. As a result, the photodetector 1 according to the first embodiment is completed.

As described above, the light-blocking groove 30*a* is formed on the back surface side of the silicon substrate 12 in the photodetector according to the first embodiment. This makes it possible to fill the black resist 30*b* into the light-blocking groove 30*a* after the APDs are formed. Therefore, the black resist is not subjected to a high-temperature process (for example, at a temperature 400° C. or more) to form the APDs. Therefore, black resist, which does not bear high temperatures, may be used as the light blocking material 30*b*.

Second Embodiment

Figure 14:
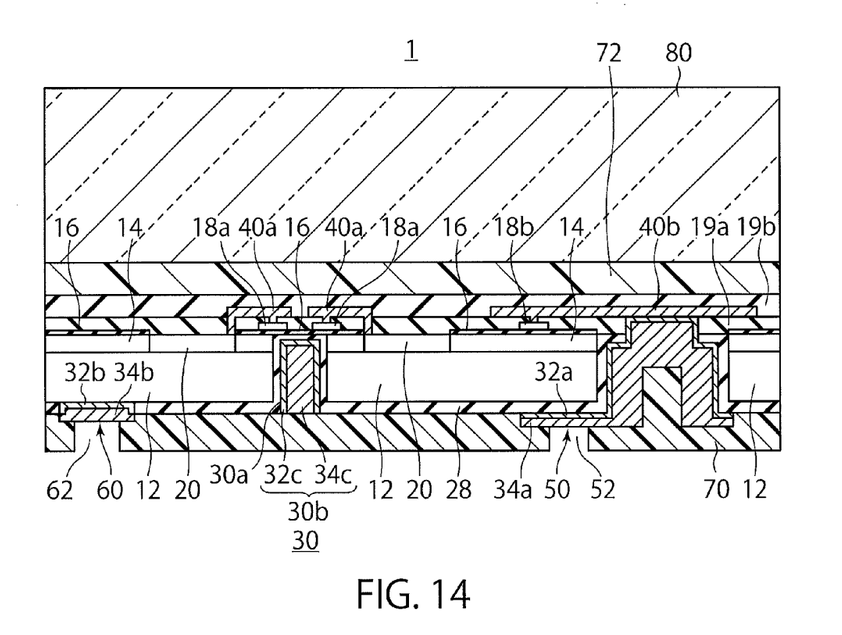
FIG. 14 is a cross-sectional view of a photodetector according to a second embodiment.

FIG. 14 is a cross-sectional view showing a photodetector according to a second embodiment. The photodetector 1 according to the second embodiment is obtained by using a metal, for example Cu, as the light blocking material 30*b* instead of black resist in the photodetector according to the first embodiment shown in FIG. 1.

Figure 15:
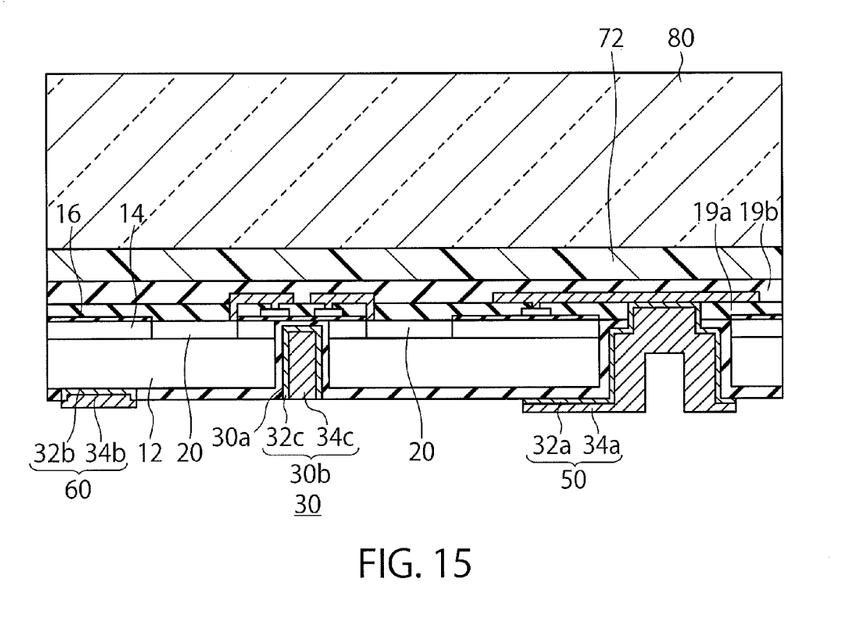
FIG. 15 is a cross-sectional view showing a method of manufacturing the photodetector according to the second embodiment.

A method of manufacturing the photodetector according to the second embodiment will be described below with reference to FIGS. 15 and 16.

The method according to the second embodiment has the same process as the method according to the first embodiment until the step shown in FIG. 10, i.e., until the opening 50*b* for TSV electrode and the opening 76 for back electrode 60 are formed.

Subsequently, a TSV electrode 50 is formed on the bottom and the side surface of the openings 50*a*, 50*b* for TSV electrode 50, a backside electrode 60 is formed on the bottom and the side surface of the opening 76 for back electrode 60, and a light blocking portion 30 is formed on the bottom and the side surface of the light-blocking groove 30*a* shown in FIG. 10. The TSV electrode 50 including a barrier metal layer 32*a* and an electrode layer 34*a*, the backside electrode 60 including a barrier metal layer 32*b* and a metal layer 34*b*, and the light blocking portion 30 including light blocking material 30*b* with a barrier metal layer 32*c* and an electrode layer 34*c* are formed by sequentially disposing a barrier metal layer of Ti, for example, and a metal layer of Cu, for example, and patterning them (FIG. 15). The barrier metal layers of Ti are formed by sputtering, and the metal layers of Cu are formed by plating. The metal layers may be formed of at least one metal selected from the group consisting of gold (Au), silver (Ag), nickel (Ni), zinc (Zn), chromium (Cr), and tin (Sn) instead of Cu. Since the light blocking material 30*b* is formed by plating, it may be filled into the light blocking portion 30 without voids.

Figure 16:
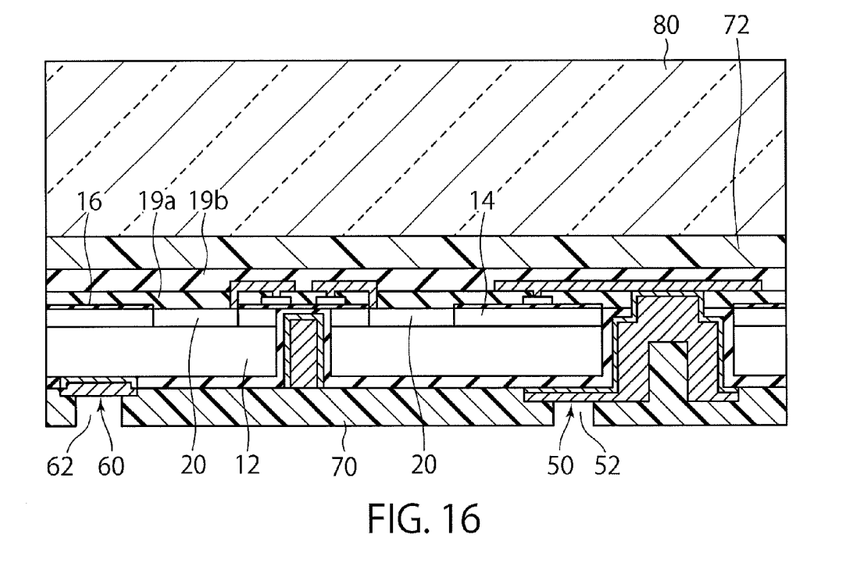
FIG. 16 is a cross-sectional view showing the method of manufacturing the photodetector according to the second embodiment.

Thereafter, a solder resist 70 is applied to the back surface of the silicon substrate 12 to cover the TSV electrode 50, the backside electrode 60, and the light blocking portion 30 as shown in FIG. 16. Subsequently, openings 52, 62 communicating with the TSV electrode 50 and the backside electrode 60 are formed, and a thermosetting treatment is performed at a temperature of 200° C. or less. The photodetector according to the second embodiment is completed in this manner.

As described above, since the metal layer 34*c* serving as the light blocking material 30*b* is formed by plating in the photodetector according to the second embodiment, it may be filled in the light-blocking groove 30*a* without voids. This may improve the reliability of the photodetector even if a metal is used as the light blocking material.

Furthermore, the barrier metal layer 32*c* and the metal layer 34*c* of the light blocking portion 30 may be formed at the same time as the barrier metal layer 32*a* and the electrode layer 34*a* of the TSV electrode 50 and the barrier metal layer 32*b* and the electrode layer 34*b* of the backside electrode 60 are formed. Therefore, the manufacturing process may become simpler than that of the first embodiment.

Third Embodiment

Figure 17:
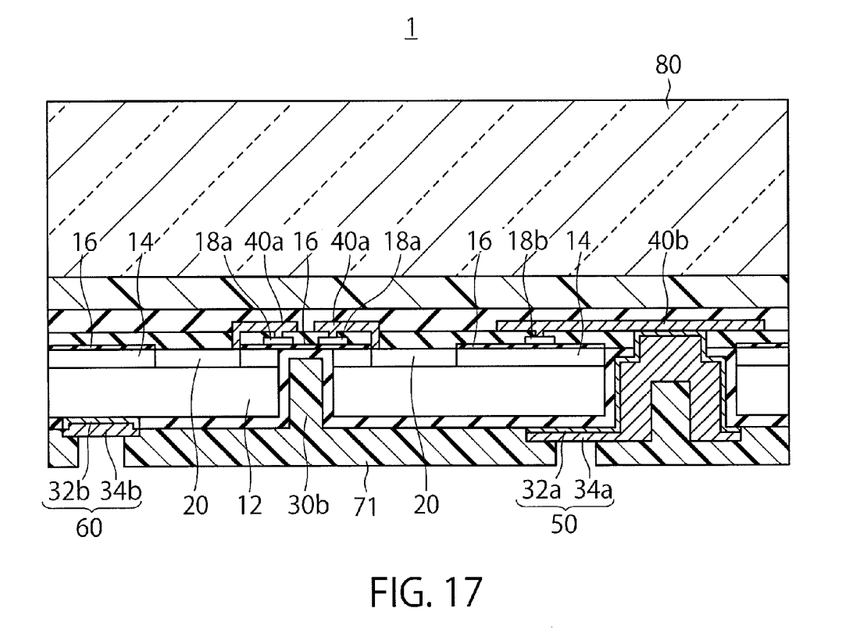
FIG. 17 is a cross-sectional view of a photodetector according to a third embodiment.

FIG. 17 is a cross-sectional view of a photodetector according to a third embodiment. The photodetector 1 according to the third embodiment is obtained by using a black solder resist 71 instead of the solder resist 70 in the photodetector according to the first embodiment shown in FIG. 1. Therefore, the light blocking material 30*b* and the solder resist 70 are the same material (black solder resist) in the third embodiment. This makes the manufacturing process simpler than that of the first embodiment.

As described above, the light-blocking grooves 30*a* of the photodetector according to the third embodiment are located on the back surface side of the silicon substrate 12 as in the case of the first embodiment. Accordingly, the black solder resist 30*b* may be filled into the light-blocking grooves 30*a* after the APDs are formed. Therefore, the black solder resist 30*b* is not subjected to a high temperature process (for example, at a temperature of 400° C. or more) for forming the APDs.

Fourth Embodiment

Figure 18:
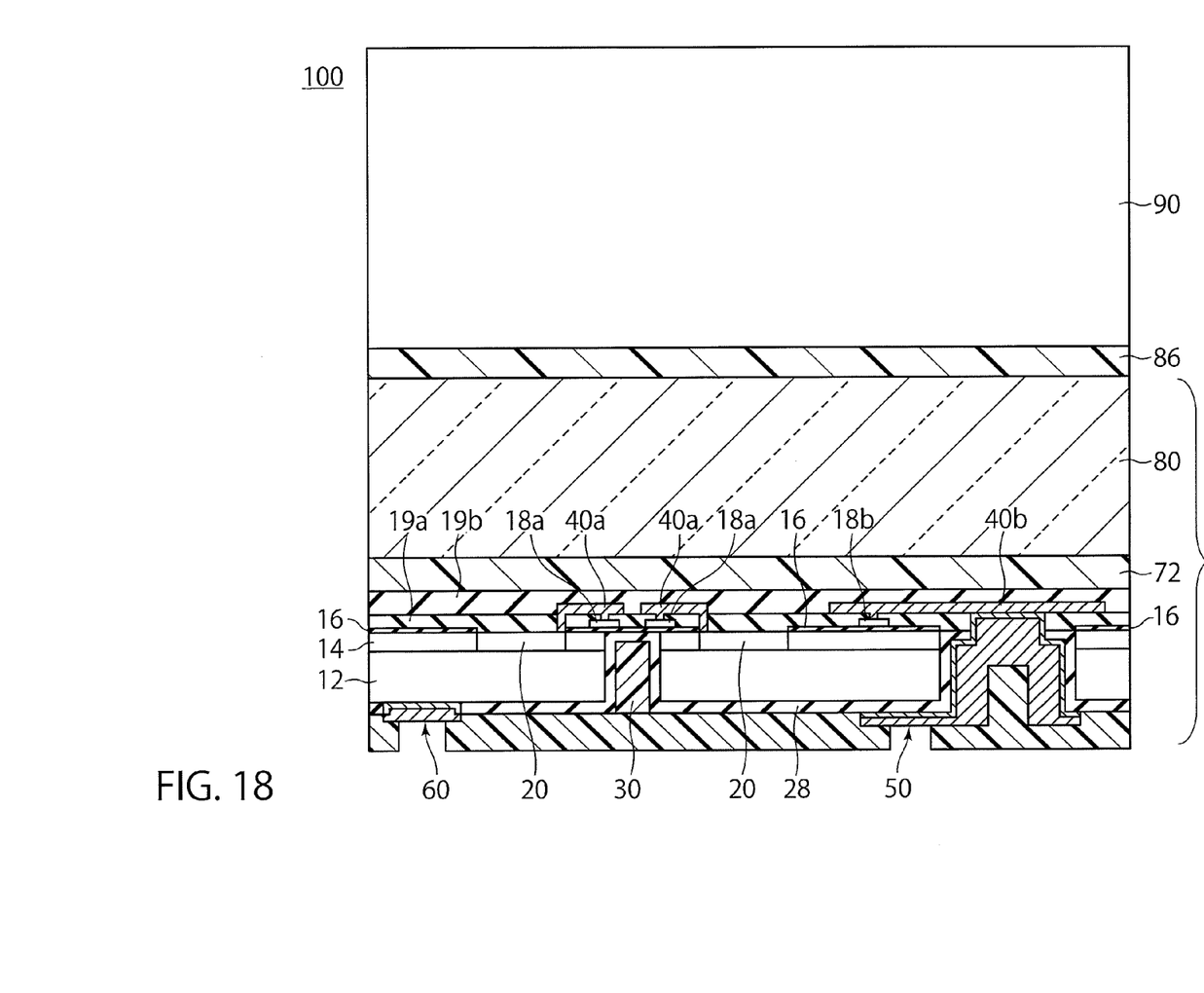
FIG. 18 is a cross-sectional view of a radiation detector according to a fourth embodiment.

FIG. 18 is a cross-sectional view of a radiation detector according to a fourth embodiment. The radiation detector 100 according to the fourth embodiment includes the photodetector 1 according to any of the first to third embodiments, and a scintillator 90 that receives radiation rays and emits visible light rays. FIG. 18 illustrates the photodetector according to the first embodiment as the photodetector 1. The photodetector 1 and the scintillator 90 are bonded by an adhesion layer 86. Scintillation materials such as LGSO or LYSO may be used as the scintillator 90. The adhesion layer 86 has a transparency sufficient enough to pass the visible light rays from the scintillator 90. The thickness of the adhesion layer 86 is approximately a few tens to 100 μm.

Since the light-blocking groove 30*a* of the photodetector in the radiation detector according to the fourth embodiment is disposed on the back surface side of the silicon substrate 12, the black resist 30*b* may be filled into the light-blocking groove 30*a* after the APDs are formed. Therefore, the black resist 30*b* is not subjected to a high-temperature process (for example, at a temperature of 400° C. or more) to form the APDs.

Fifth Embodiment

Figure 19A:
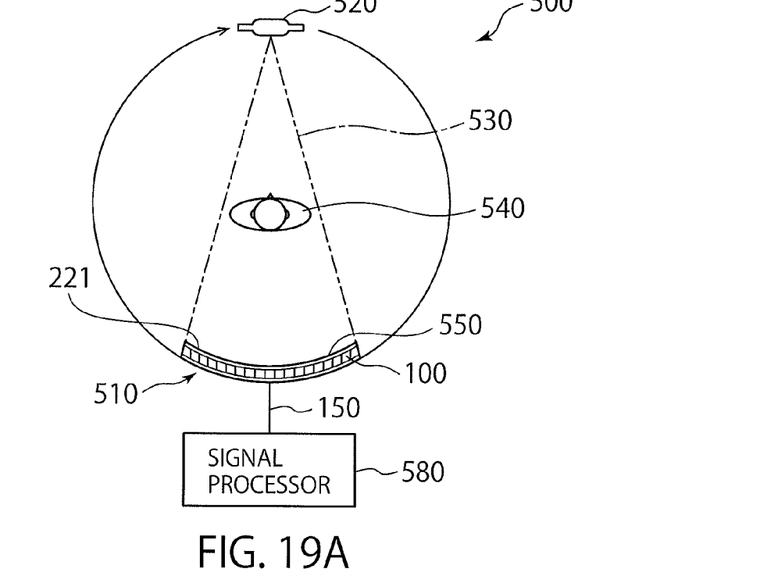
FIG. 19A is a cross-sectional view of a radiation detection apparatus according to a fifth embodiment.

The structure of a radiation detection apparatus according to a fifth embodiment will be described with reference to FIGS. 19A to 19C. FIG. 19A is a cross-sectional view of the radiation detection apparatus 500 according to the fifth embodiment.

As shown in FIG. 19A, the radiation detection apparatus 500 includes a radiation tube 520, radiation detectors 510 facing the radiation tube 520, and a signal processor 580.

The radiation tube 520 emits radiation beams 530 such as X-rays to form a fan-shape toward the radiation detectors 510 facing the radiation tube 520. The radiation beams 530 emitted from the radiation tube 520 pass through an object 540 on a stage (not shown) to be incident to the radiation detectors 510.

The radiation detectors 510 receive, at incident surfaces 221, the radiation beams 530, which were emitted from the radiation tube 520 and a part of which pass through the object 540, convert the radiation beams to visible light rays, and detect them as electrical signals. The radiation detection apparatus 500 includes a plurality of radiation detectors 510 that are substantially arranged on an arc, a collimator 550 disposed on the incident surface 221 side of the radiation detectors 510, and a signal processor 580 connected to the electrodes of the radiation detectors 510 disposed on the opposite side to the radiation tube 520.

Each radiation detector 510 converts radiation rays (radiation beams 530) from the incident surface 221 to visible light rays. Photoelectric conversion elements 114 that will be described later convert (by photoelectric conversion) the visible light rays to electrical signals (electric current).

The collimator 550 is an optical system disposed to the incident surface 221 side of the radiation detectors 510 to refract radiation rays so that they are incident to the radiation detectors 510 in parallel to each other.

The signal processor 580 receives the electrical signals (electric current) photoelectrically converted by the radiation detectors 510 via a signal line 150, and calculates the energy of the radiation rays incident to the radiation detectors 510 based on the value of the electric current. Furthermore, the signal processor 580 generates a radiological image of the object 540, which is colored depending on the materials of the object 540, based on the energy levels of the radiations rays incident to the radiation detectors 510.

The radiation tube 520 and the radiation detectors 510 are arranged to rotate around the object 540. The radiation detection apparatus 500 generates a tomographic image of the object 540 in this manner.

The radiation detection apparatus 500 according to the fifth embodiment may be applied not only to form a tomographic image of a human being, animal, or plant, but also to serve as a testing apparatus for security apparatus, which makes fluoroscopic images of the inside of an object.

The structures of the radiation detector 510 and the radiation detector 100 will be described below with reference FIGS. 19B and 19C. FIG. 19B is a configuration diagram illustrating a plurality of radiation detectors 510 substantially arranged on an arc, and FIG. 19C shows a schematic configuration of the radiation detector 100 included in the radiation detector 510.

Figure 19B:
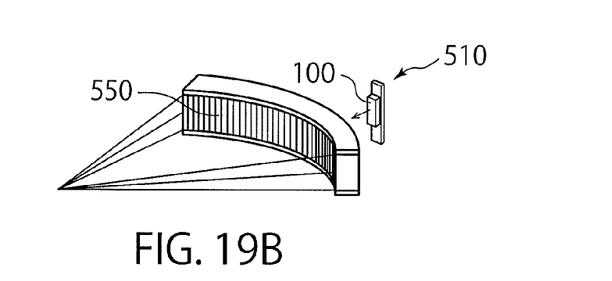
FIG. 19B is a diagram showing a plurality of radiation detectors substantially arranged along an arc.

As shown in FIG. 19B, the radiation detectors 510 are substantially arranged on an arc, and the collimator 550 is disposed on the incident surface side thereof. In each radiation detector 510, the radiation detector 100 is fixed on an element support plate 200, as shown in FIG. 19C. The radiation detector 100 includes a photoelectric conversion layer 110 in which a plurality of photoelectric conversion elements 114 are disposed, and a scintillator 210 that converts radiation rays to scintillation rays. The photoelectric conversion layer 110 and the scintillator 210 are bonded to each other to form a multilayer structure, in which the light receiving side of the photoelectric conversion layer 110 is bonded to the light emitting side of the scintillator 210.

The scintillator 210 includes light reflecting layers 215 that are arranged with a predetermined pitch in two directions that are perpendicular to each other. The photoelectric conversion layer 110 and the scintillator 210 are divided into a plurality of photoelectric conversion elements 220 arranged in a matrix by the light reflecting layers 215. The photoelectric conversion elements 220 each include a plurality of photoelectric conversion elements 114. The energy of incident radiation rays is detected for each photoelectric conversion element 220.

Figure 19C:
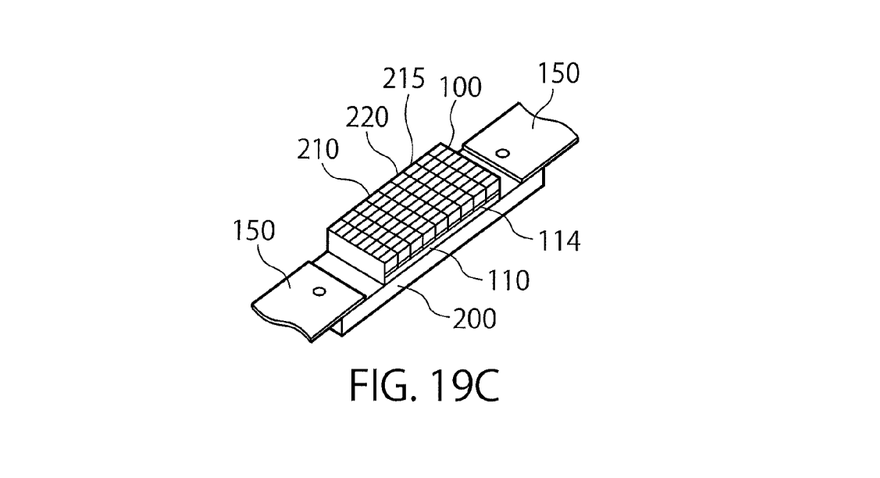
FIG. 19C is a diagram showing a schematic structure of the radiation detector.

In the radiation detection apparatus 500 illustrated in FIGS. 19A to 19C, the radiation detector according to the fourth embodiment is used as the radiation detector 510. The photoelectric conversion element 114 corresponds to the pixel 10 in the first to third embodiments.

According to the fifth embodiment, a radiation detection apparatus including a radiation detector capable of reducing the optical crosstalk caused by adjacent light detection cells may be provided.

The radiation detector according to the fourth embodiment, and the radiation detection apparatus according to the fifth embodiment may be applied not only to form a tomographic image of a human being, animal, or plant, but also to serve as a security apparatus or testing apparatus that makes fluoroscopic images of the inside of objects.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetector comprising:
   a semiconductor substrate with a first face and a second face that is opposite to the first face;
   a groove formed on the second face of the semiconductor substrate;
   a plurality of pixels disposed to the semiconductor substrate,
   each pixel including:
   a plurality of light detection cells disposed on the first face of the semiconductor substrate, each light detection cell having a first terminal and a second terminal that connect to the semiconductor substrate, each light detection cell being surrounded by the groove when viewed from a side of the second face of the semiconductor substrate;
   a first wiring line disposed on the first face of the semiconductor substrate to connect to the first terminal of each of the light detection cells;
   a first opening formed in the second face of the semiconductor substrate, the first opening penetrating the semiconductor substrate to expose a part of the first wiring line;
   a first insulating film covering the second face of the semiconductor substrate, a side face of the first opening, and a side face and a bottom of the groove;
   a second opening formed in the first insulating film to expose a part of the second face of the semiconductor substrate;
   a first electrode disposed in the first opening to connect to the first wiring line;
   a second electrode disposed in the second opening to connect to the second surface of the semiconductor substrate; and
   a light blocking material filled to the groove.

2. The photodetector according to claim 1, wherein the groove surrounds the light detection cells so that at least one opening per each light detection cell is present when viewed from the side of the second face.

3. The photodetector according to claim 1, wherein the light blocking material is black resist.

4. The photodetector according to claim 1, wherein the light blocking material is a metal.

5. The photodetector according to claim 1, wherein the semiconductor substrate includes an n-type semiconductor substrate and a p-type epitaxial layer disposed on the n-type substrate, and the light detection cells are disposed on the p-type epitaxial layer.

6. The photodetector according to claim 1, wherein the pixels are arranged in an array form.

7. The photodetector according to claim 1, wherein each of the light detection cells includes an avalanche photodiode.

8. The photodetector according to claim 1, further comprising:
 a second insulating film disposed on the first face of the semiconductor substrate to cover the light detection cells and the first wiring line; and
 a support member disposed on a side of the second insulating film opposite to the semiconductor substrate, the support member being bonded with the second insulating film via an adhesion material.

9. A radiation detector comprising:
 a scintillator that converts radiation rays to visible light rays; and
 the photodetector according to claim 1 that receives the visible light rays converted by the scintillator.

10. A radiation detection apparatus comprising:
 the radiation detector according to claim 9;
 a radiation tube disposed to face the radiation detector, the radiation tube emitting radiation rays to the radiation detector, an object being disposed between the radiation tube and the radiation detector; and
 a signal processor that processes signals outputted from the radiation detector.

11. A method of manufacturing a photodetector comprising:
 forming a plurality of pixels on a first face of a semiconductor substrate that also has a second face opposite to the first face, each pixel including a plurality of light detection cells each having a first terminal and a second terminal that connects to the semiconductor substrate;
 forming a wiring line connecting to the first terminal of each of the light detection cells on the first face of the semiconductor substrate;
 forming a first opening in the second face of the semiconductor substrate, the first opening penetrating the semiconductor substrate to expose the wiring line at a bottom thereof, and a groove in the second face of the semiconductor substrate, the groove surrounding each of the light detection cells when viewed from the second face;
 forming a first insulating film covering the second face of the semiconductor substrate, a side face of the first opening, and a side face and a bottom of the groove;
 forming a second opening in the first insulating film to expose the second face of the semiconductor substrate;
 forming a first electrode connecting to the first wiring line in the first opening, and a second electrode connecting to the second face of the semiconductor substrate in the second opening; and
 filling a light blocking material into the groove.

12. The method according to claim 11, further comprising:
 before the forming of the first opening and the groove, bonding a transparent support member to the first face of the semiconductor substrate, and thereafter etching the semiconductor substrate from a side of the second face to thin the semiconductor substrate.

13. The method according to claim 11, wherein the light blocking material is a material of the first electrode.

14. The method of manufacturing a photodetector according to claim 11, wherein the light blocking material is black resist.

* * * * *